United States Patent
Lee

(10) Patent No.: US 12,261,206 B2
(45) Date of Patent: *Mar. 25, 2025

(54) METHOD OF FORMING VIAS IN A GAN/DIAMOND WAFER

(71) Applicant: RFHIC Corporation, Anyang-si (KR)

(72) Inventor: Won Sang Lee, Chapel Hill, NC (US)

(73) Assignee: RFHIC Corporation, Anyang-si (KR)

( * ) Notice: Subject to any disclaimer, the term of this patent is extended or adjusted under 35 U.S.C. 154(b) by 53 days.

This patent is subject to a terminal disclaimer.

(21) Appl. No.: 18/176,427

(22) Filed: Feb. 28, 2023

(65) Prior Publication Data

US 2023/0231019 A1    Jul. 20, 2023

Related U.S. Application Data

(62) Division of application No. 16/897,329, filed on Jun. 10, 2020, now Pat. No. 11,652,146.

(Continued)

(51) Int. Cl.
*H01L 29/20* (2006.01)
*H01L 21/02* (2006.01)
(Continued)

(52) U.S. Cl.
CPC .... *H01L 29/2003* (2013.01); *H01L 21/02378* (2013.01); *H01L 21/02488* (2013.01);
(Continued)

(58) Field of Classification Search
CPC ......... H01L 21/02378; H01L 21/02488; H01L 21/02527; H01L 21/0254; H01L 21/76871;
(Continued)

(56) References Cited

U.S. PATENT DOCUMENTS

| 5,939,201 A | 8/1999 | Boire et al. |
| 7,749,863 B1 | 7/2010 | Micovic |

(Continued)

FOREIGN PATENT DOCUMENTS

| CN | 1996556 A | 7/2007 |
| JP | 2013-125971 A | 6/2013 |

(Continued)

OTHER PUBLICATIONS

Office Action mailed Dec. 17, 2021 in Taiwan Patent Application No. 110120356 with machine translation, 9 pages.

(Continued)

*Primary Examiner* — Mohammad M Hoque
(74) *Attorney, Agent, or Firm* — Kim & Stewart LLP

(57) ABSTRACT

Wafers including a diamond layer and a semiconductor layer having III-Nitride compounds and methods for fabricating the wafers are provided. A nucleation layer, at least one semiconductor layer having III-Nitride compound and a protection layer are formed on a silicon substrate. Then, a silicon carrier wafer is glass bonded to the protection layer. Subsequently the silicon substrate, nucleation layer and a portion of the semiconductor layer are removed. Then, an intermediate layer, a seed layer and a first diamond layer are sequentially deposited on the III-Nitride layer. Next, the silicon carrier wafer and the protection layer are removed. Then, a silicon substrate wafer that includes a protection layer, silicon substrate and a diamond layer is prepared and glass bonded to the first diamond layer.

14 Claims, 8 Drawing Sheets

Related U.S. Application Data

(60) Provisional application No. 62/971,869, filed on Feb. 7, 2020.

(51) Int. Cl.

| | | |
|---|---|---|
| *H01L 21/768* | (2006.01) | |
| *H01L 23/00* | (2006.01) | |
| *H01L 29/16* | (2006.01) | |
| *H01L 29/205* | (2006.01) | |
| *H01L 29/267* | (2006.01) | |
| *H01L 29/66* | (2006.01) | |

(52) U.S. Cl.
CPC .... *H01L 21/02527* (2013.01); *H01L 21/0254* (2013.01); *H01L 21/76871* (2013.01); *H01L 21/76897* (2013.01); *H01L 24/94* (2013.01); *H01L 29/1602* (2013.01); *H01L 29/205* (2013.01); *H01L 29/267* (2013.01); *H01L 29/66462* (2013.01)

(58) Field of Classification Search
CPC ............... H01L 21/76897; H01L 24/94; H01L 29/1602; H01L 29/205; H01L 29/267; H01L 29/66462; H01L 29/2003; H01L 21/76251–76259
USPC .......................................................... 257/77
See application file for complete search history.

(56) References Cited

U.S. PATENT DOCUMENTS

| | | | |
|---|---|---|---|
| 7,884,373 B2 | 2/2011 | Korenstein et al. | |
| 7,943,485 B2 | 5/2011 | Francis et al. | |
| 8,674,405 B1* | 3/2014 | Babic ................. | H01L 21/0262 |
| | | | 257/615 |
| 8,940,620 B2 | 1/2015 | Koudymov et al. | |
| 9,711,534 B2 | 7/2017 | Liang et al. | |
| 10,043,700 B2 | 8/2018 | Francis | |
| 10,128,107 B1 | 11/2018 | Cho et al. | |
| 10,963,111 B1* | 3/2021 | Xiao ..................... | G06F 3/0446 |
| 2002/0173120 A1 | 11/2002 | Enquist | |
| 2002/0180031 A1* | 12/2002 | Yamaguchi ............. | H01L 23/10 |
| | | | 257/E23.193 |
| 2004/0029359 A1 | 2/2004 | Letertre et al. | |
| 2005/0164482 A1 | 7/2005 | Saxler | |
| 2006/0266280 A1 | 11/2006 | Francis et al. | |
| 2008/0142813 A1 | 6/2008 | Chang et al. | |
| 2008/0206569 A1 | 8/2008 | Whitehead et al. | |
| 2009/0078943 A1 | 3/2009 | Ishida et al. | |
| 2009/0133811 A1* | 5/2009 | Moriceau ................ | H01F 10/24 |
| | | | 156/151 |
| 2010/0012947 A1 | 1/2010 | Faure | |
| 2010/0155900 A1* | 6/2010 | Korenstein ....... | H01L 21/02527 |
| | | | 257/E21.085 |
| 2011/0186959 A1 | 8/2011 | Jerome et al. | |
| 2012/0168773 A1 | 7/2012 | Sung | |
| 2013/0157440 A1 | 6/2013 | Koudymov et al. | |
| 2013/0292691 A1 | 11/2013 | Henley et al. | |
| 2014/0038392 A1 | 2/2014 | Yonehara et al. | |
| 2015/0255591 A1 | 9/2015 | Sadaka | |
| 2016/0308010 A1 | 10/2016 | Viswanathan et al. | |
| 2017/0372965 A1 | 12/2017 | Nishibayashi et al. | |
| 2018/0151404 A1 | 5/2018 | Francis | |
| 2018/0366558 A1 | 12/2018 | Kaplun et al. | |
| 2019/0326162 A1 | 10/2019 | Kaplun et al. | |
| 2019/0326199 A1* | 10/2019 | Lin ................... | H01L 21/76898 |
| 2020/0273717 A1 | 8/2020 | Dai et al. | |
| 2021/0249258 A1 | 8/2021 | Lee | |

FOREIGN PATENT DOCUMENTS

| | | |
|---|---|---|
| KR | 10-2011-0099720 A | 9/2011 |
| KR | 10-2017-0137180 A | 12/2017 |
| TW | 200826322 A | 6/2008 |
| TW | 200905731 A | 2/2009 |
| TW | 201324704 A | 6/2013 |

OTHER PUBLICATIONS

Office Action mailed Feb. 18, 2022 in Taiwan Patent Application No. 110120357 with machine translation, 7 pages.
Office Action mailed Dec. 21, 2021 in Taiwan Patent Application No. 110120362 with machine translation, 4 pages.
Office Action mailed Dec. 17, 2021 in Taiwan Patent Application No. 110120366 with machine translation, 10 pages.
Non-Final Office Action mailed Mar. 3, 2022 in U.S. Appl. No. 16/905,870, 11 pages.
Non-Final Office Action mailed Mar. 3, 2022 in U.S. Appl. No. 16/914,474, 11 pages.
Non-Final Office Action mailed Dec. 24, 2021 in U.S. Appl. No. 16/914,477, 13 pages.

* cited by examiner

Bonding

METHOD OF FORMING VIAS IN A GAN/DIAMOND WAFER

CROSS-REFERENCE TO PRIOR APPLICATIONS

This application is a divisional of U.S. patent application Ser. No. 16/897,329, filed Jun. 10, 2020, which claims priority to U.S. Provisional Application No. 62/971,869, filed Feb. 7, 2020, which are hereby incorporated by reference in their entirety.

BACKGROUND

A. Technical Field

The present invention relates to semiconductor wafers, and more particularly, to wafers having a diamond layer and a semiconductor layer including III-nitride semiconductor material and methods for fabricating the wafers and devices.

B. Background of the Invention

Gallium Nitride (GaN) or AlGaN or AlN has electrical and physical properties that make it highly suitable for radio frequency (RF) devices, such as high electron mobile transistors (HEMT). In general, an RF device produces a large amount of heat energy during operation, requiring a mechanism to extract the heat energy from the device to avoid device failure. Diamond is known to have a good thermal conductivity and can be used as material for a substrate on which the AlGaN/GaN layer is formed.

One conventional approach to form an AlGaN/GaN HEMT layer on a diamond layer is depositing AlGaN/GaN HEMT layer directly on a silicon substrate, removing the silicon substrate and forming a diamond layer on the AlGaN/GaN HEMT layer. This approach is attractive for its low manufacturing cost. However, the conventional technique is not suitable for manufacturing AlGaN/GaN HEMT in a consistent manner. First, the thickness of the wafers is much less than 200 μm, where a typical semiconductor processing equipment has robot arms for carrying semiconductor wafers and the robot arms require that the thickness of each wafer is at least 500 μm. Second, the conventional wafers are very thin, the wafers may not have sufficient mechanical strength to withstand the thermal and mechanical stresses during the subsequent processes for forming semiconductor devices in wafers. Thus, there is a need for a new technique for providing mechanical strength for the wafers and to meet the requirement for the robot arms used in the semiconductor processing.

SUMMARY OF THE DISCLOSURE

According to one aspect of the present invention, a semiconductor wafer includes: a first diamond layer; a silicon substrate disposed on the first diamond layer; a bonding layer disposed on the silicon substrate; a second diamond layer disposed on the bonding layer; and at least one semiconductor layer disposed on the second diamond layer and including a III-Nitride compound.

According to one aspect of the present invention, a method for fabricating a semiconductor wafer includes: disposing a nucleation layer a silicon substrate; disposing at least one semiconductor layer on the nucleation layer, the at least one semiconductor layer including a III-Nitride compound; disposing a protection layer on the at least one semiconductor layer; bonding a carrier wafer to the protection layer; removing the silicon substrate, the nucleation layer and a portion of the at least one semiconductor layer; disposing a first diamond layer on the at least one semiconductor layer; removing the carrier wafer and the protection layer; and bonding a silicon substrate wafer to the first diamond layer, the silicon substrate wafer including a silicon substrate and a second diamond layer.

According to one aspect of the present invention, a semiconductor wafer includes: a diamond layer; an intermediate layer disposed on a top surface of the diamond layer; at least one semiconductor layer including a III-Nitride compound and including one or more semiconductor devices formed therein; a first metal layer disposed on the at least one semiconductor layer; one or more vias extending from the first metal layer to a bottom surface of the diamond layer; a second metal layer disposed on the first metal layer and in a portion of the one or more vias; and a third metal layer disposed on the bottom surface of the diamond layer and on a side surface of the one or more vias and being in electrical contact with the second metal layer.

According to one aspect of the present invention, a method for processing a semiconductor wafer includes: disposing and patterning a first metal layer on a semiconductor layer of a semiconductor wafer, wherein the semiconductor wafer includes a support wafer, a bonding layer, a diamond layer, an intermediate layer and the semiconductor layer; drilling one or more holes from the first metal layer toward the support layer to thereby form one or more vias that extend from the first metal layer into the support wafer; disposing a second metal layer on the first metal layer and in a portion of the one or more vias; and removing the support layer and the bonding layer to expose a surface of the diamond layer.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system, a device, or a method on a tangible computer-readable medium.

One skilled in the art shall recognize: (1) that certain steps may optionally be performed; (2) that steps may not be limited to the specific order set forth herein; and (3) that certain steps may be performed in different orders, including being done contemporaneously.

Elements/components shown in diagrams are illustrative of exemplary embodiments of the disclosure and are meant to avoid obscuring the disclosure. Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. The appearances of the phrases "in one embodiment," "in an embodiment," or "in embodiments" in various places in the specification are not necessarily all referring to the same embodiment or embodiments. The terms "include," "including," "comprise," and "comprising" shall be understood to be open terms and any lists that follow are examples and not meant to be limited to the listed items. Any headings used herein are for organizational purposes only and shall not be used to limit the scope of the description or the claims. Furthermore, the use of certain terms in various places in the specification is for illustration and should not be construed as limiting.

Figure 1:
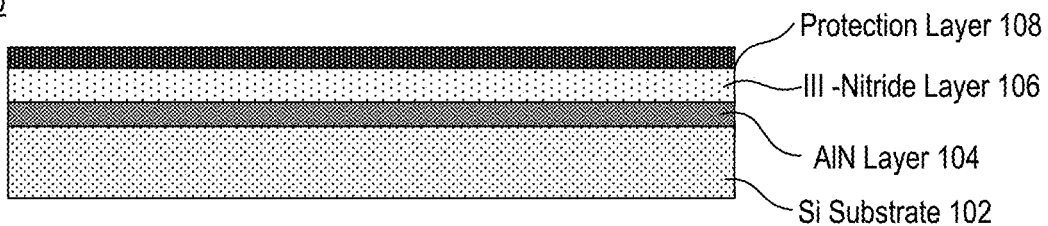
FIGS. 1-12 show an exemplary process for fabricating a wafer that includes two diamond layers and a III-Nitride layer according to embodiments of the present disclosure.

FIGS. 1-12 show an exemplary process for forming a wafer that includes a diamond layer and a III-Nitride layer (or, equivalently semiconductor layer that includes III-Nitride compound) according to embodiments of the present disclosure. As depicted in FIG. 1, the wafer 100 may include a silicon substrate 102, an AlN layer 104 and a III-Nitride layer 106, and a protection layer 108.

Figure 2A:
Figure 2B:
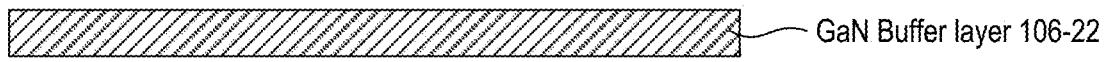

In embodiments, the III-Nitride layer 106 may include one or more layers that each include a GaN compound, such as hexagonal AlGaN/GaN, InAlN/GaN or cubic AlGaN/GaN. In the following sections, a III-Nitride layer may collectively refer to one or more layers that each include a III-Nitride compound. FIG. 2A shows an exemplary III-Nitride layer 106-1 that includes: a GaN buffer layer 106-14; and at least one of AlGaN layer and InAlN layer 106-12. FIG. 2B shows another exemplary III-Nitride layer 106-2 that includes only one GaN buffer layer 106-22.

In embodiments, the protection layer 108 may protect the III-Nitride layer 106 from thermal and mechanical damages that may occur during the subsequent processes. For instance, if the glass coating 112 (in FIG. 3) is directly attached to the III-Nitride layer 106, the mismatch of coefficients of thermal expansion (CTE) between the glass coating 112 and the III-Nitride layer 106 may generate stress on the III-Nitride layer 106, generating negative impact on the performance of semiconductor devices to be formed in the III-Nitride layer 106. In embodiments, the material and thickness of the protection layer 108 may be selected to mitigate the stress due to the mismatch of CTEs. In embodiments, the protection layer 108, which may be formed of a material that includes one or more of SiN, poly silicon, $Al_2O_3$, AlN and GaN, may be deposited by a suitable deposition technique.

In general, the large lattice mismatch between silicon in the silicon substrate 102 and GaN in the III-Nitride layer 106 may lead to cracks in the GaN buffer when cooling the heterostructure from the growth temperature to the room temperature. In embodiments, the AlN layer (or shortly, nucleation layer) 104 may be formed on the silicon substrate 102 to prevent cracks in the GaN buffer layer 106-14 (or 106-22) and/or growth of the cracks to the AlGaN/InAlN layer 106-12. In embodiments, the AlN layer 104 and the III-Nitride layer 106 may be formed on the silicon substrate 102 by conventional wafer processing techniques, such as metal-organic chemical vapor deposition (MOCVD) technique.

Figure 3:
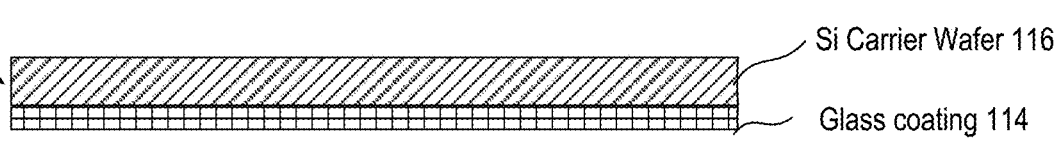
Figure 3:
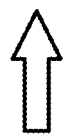
Figure 3:
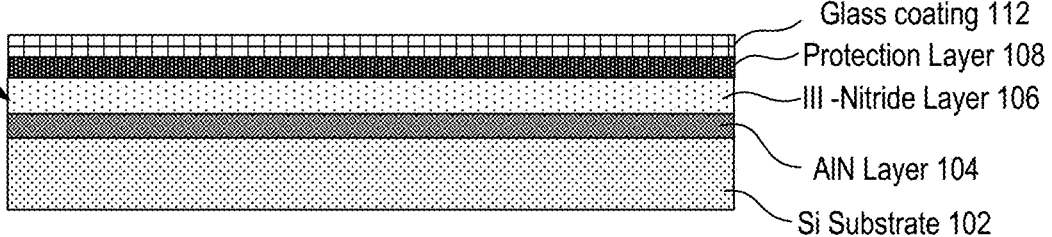
Figure 4:
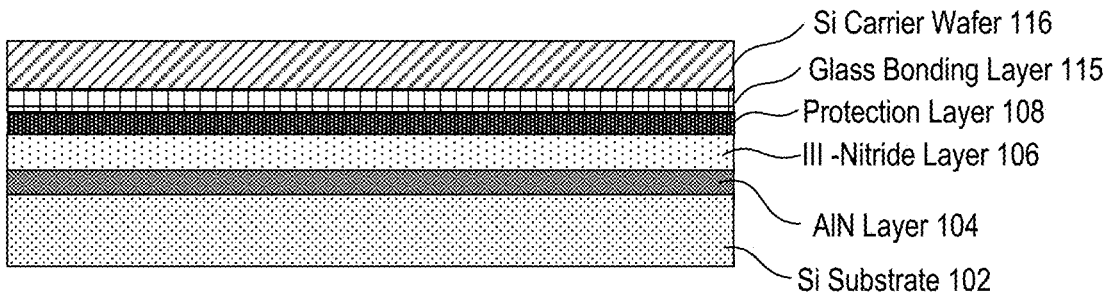

FIG. 3 shows a process of bonding a carrier wafer 110 to the wafer 109 according to embodiments of the present disclosure. As depicted, the carrier wafer 110 may include a silicon carrier wafer 116 and a glass coating 114 formed on its surface facing the wafer 109. In embodiments, the wafer 109 may be prepared by forming a glass coating on the protection layer 108. Then, the silicon carrier wafer 110 is mounted on the wafer 109 and heated at the temperature of 900-1000° C. to melt the glass coatings 112 and 114 and to form a glass bonding layer. FIG. 4 shows a wafer 118 that include the silicon carrier wafer 110 bonded to the wafer 109 by the glass bonding process, where the bonding layer 115 may be formed by melting the glass coatings 112 and 114.

Figure 5:
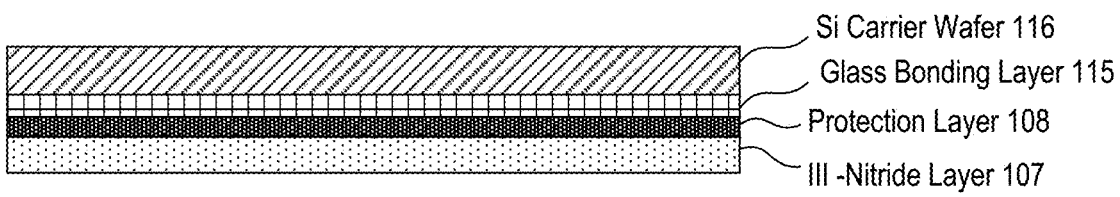

In embodiments, as depicted in FIG. 5, the silicon substrate 102, AlN layer 104 and a portion of the III-Nitride layer 106 in the wafer 118 may be removed to form the wafer 120. In embodiments, the silicon substrate 102 may be removed by one or more of grinding, lapping, polishing and dry etching processes, even though other suitable process may be used to remove the silicon substrate 102. In embodiments, the AlN nucleation layer 104 may be removed by a wet etching process, even though other suitable process may be used to remove the AlN layer 104.

In embodiments, as discussed above in conjunction with FIG. 2A, the III-Nitride layer 106 may include the AlGaN/InAlN layer 106-12 and GaN layer 106-14. In alternative embodiment, as discussed above in conjunction with FIG. 2B, the III-Nitride layer 106 may include only GaN layer 106-22. In both cases, each of the GaN layers may include a portion near the interface between the GaN layer 106-22 and AlN layer 104, where the portion includes cracks developed during deposition of the GaN layer 106-22 and/or AlGaN/InAlN layer 106-12. As such, the portion of the GaN layer having the cracks may be removed so that the remaining GaN layer may not include any crack. In the wafer 120, the III-Nitride layer 107 refers to a III-Nitride layer that is formed by removing the portion of the GaN layer from the III-nitride layer 106.

Figure 6:
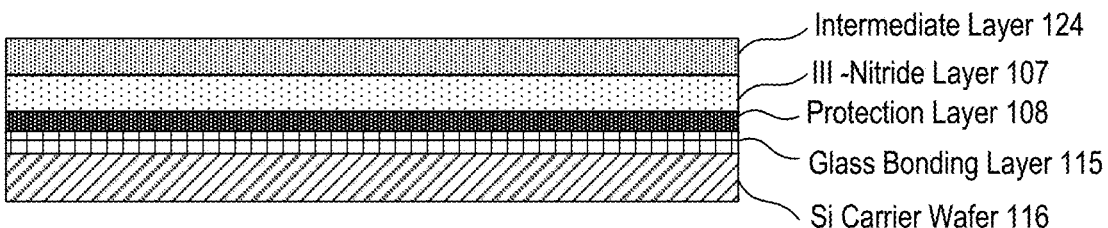

As depicted in FIG. 6, an intermediate layer 124 may be formed on the III-Nitride layer 107, where the intermediate layer 124 may include a first intermediate layer and a second intermediate layer (or equivalently seed layer). If a diamond layer is directly deposited on the III-Nitride layer 107, the mismatch of coefficients of thermal expansion (CTE) between the diamond layer and the III-Nitride layer 107 may generate thermal stress on the III-Nitride layer 107 during formation of the diamond layer, and as such, the first intermediate layer may be deposited to mitigate the thermal stress. In embodiments, the material and thickness of the first intermediate layer may be selected to mitigate the stress due to the mismatch of CTEs. In embodiments, the first intermediate layer may be formed of a dielectric material, such as poly-Si, $SiO_2$, $Al_2O_3$ or SiN.

In embodiments, the second intermediate layer (i.e., a seed layer) may be formed on the top surface of the first intermediate layer. To form the seed layer, the wafer 122 may be submerged in an aqueous suspension of diamond nano particle (diamond seed particles) so that the top surface of the first intermediate layer may be in direct contact with the aqueous suspension. The diamond particles may be adsorbed onto the surface of the first intermediate layer, to thereby form the seed layer. Depending on the exposure time in the suspension and the concentration of the diamond particles, the density of the particles in the seed layer may be determined. In embodiments, the diamond particles may adhere to the seed layer better than to the first intermediate layer.

Figure 7:
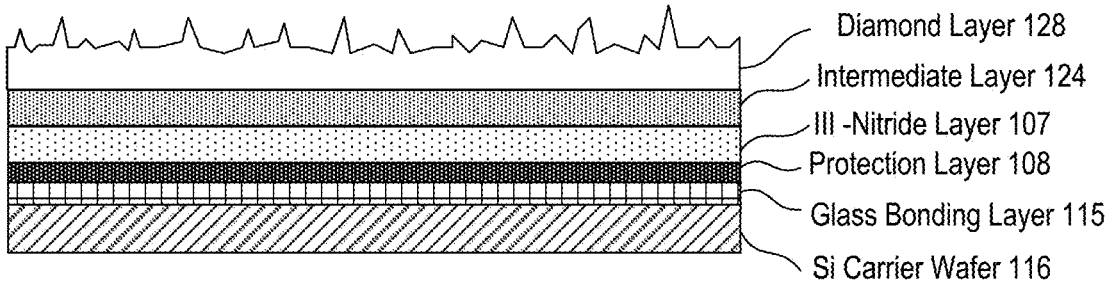
Figure 8:
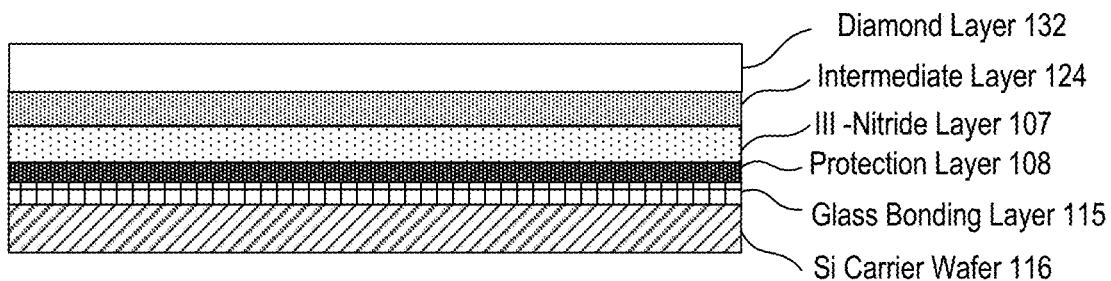

In embodiments, after forming the intermediate layer 124, a diamond layer 128 may be deposited on the intermediate layer 124, to thereby form the wafer 126 in FIG. 7. In embodiments, the diamond layer 128 may be formed by chemical vapor deposition (CVD) technique, even though other suitable techniques may be used. Then, a lapping process may be carried out to reduce the surface roughness of the diamond layer 128. In FIG. 8, the wafer 130 may include a diamond layer 132 that has a top surface with enhanced flatness by the lapping process.

Figure 9:
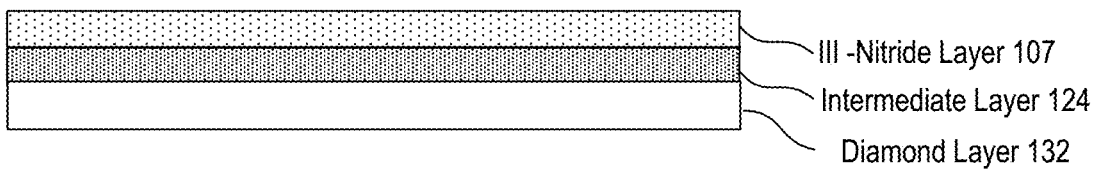

In embodiments, the silicon carrier wafer 116, glass bonding layer 115, and protection layer 108 may be removed from the wafer 130, as depicted in FIG. 9. In embodiments, the thickness of the wafer 134 may be so thin that the wafer 134 may not have sufficient mechanical strength to withstand the thermal and mechanical stresses during the subsequent processes for forming semiconductor devices in the wafer 134. Thus, to bolster the mechanical strength of the wafer 134, a support wafer 140 may be bonded to the wafer 134, as shown in FIG. 10.

Figure 10:
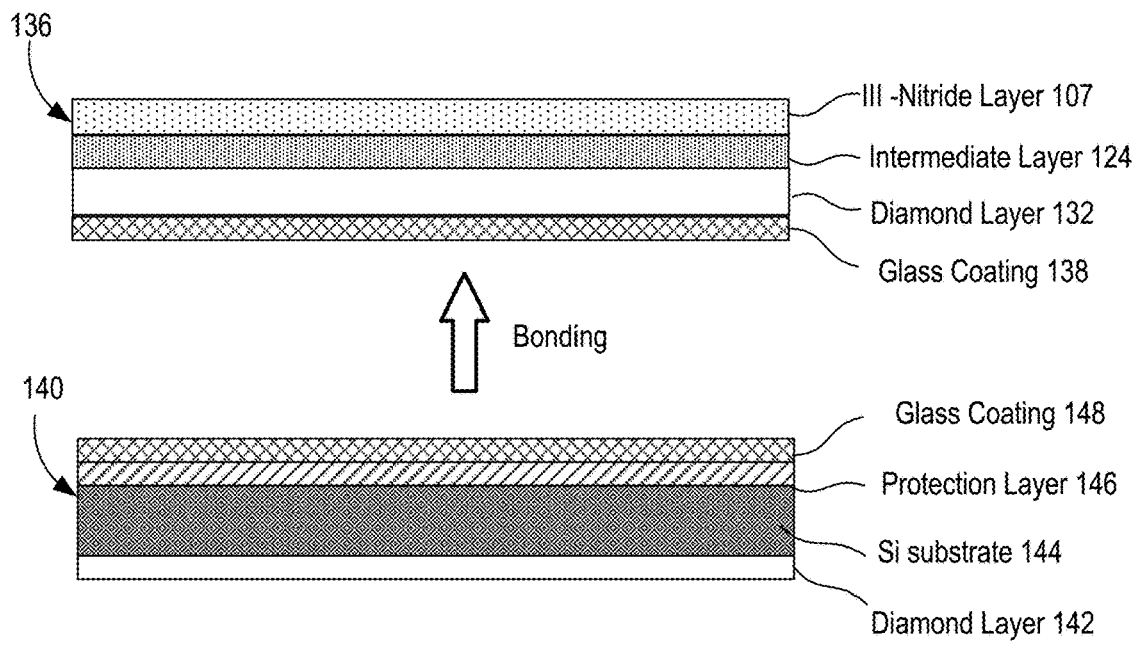

FIG. 10 shows a process of bonding a support wafer 140 to a wafer 136 according to embodiments of the present disclosure. As depicted, the wafer 136 may be prepared by forming a glass coating 138 on the diamond layer 132 of the wafer 134. In embodiments, the support wafer 140 may be prepared by depositing a diamond layer 142 on a silicon substrate 144 on the bottom surface of the silicon substrate 144 and depositing a protection layer 146 and a glass coating 148 on the top surface of the silicon substrate 144. In embodiments, the diamond layer 142 may be deposited by a chemical vapor deposition (CVD) technique, even though other suitable techniques may be used. In embodiments, the protection layer 146, which may be formed of a material that includes one or more of SiN, poly silicon, $Al_2O_3$, AlN and GaN, may be deposited by a suitable deposition technique.

Figure 11:
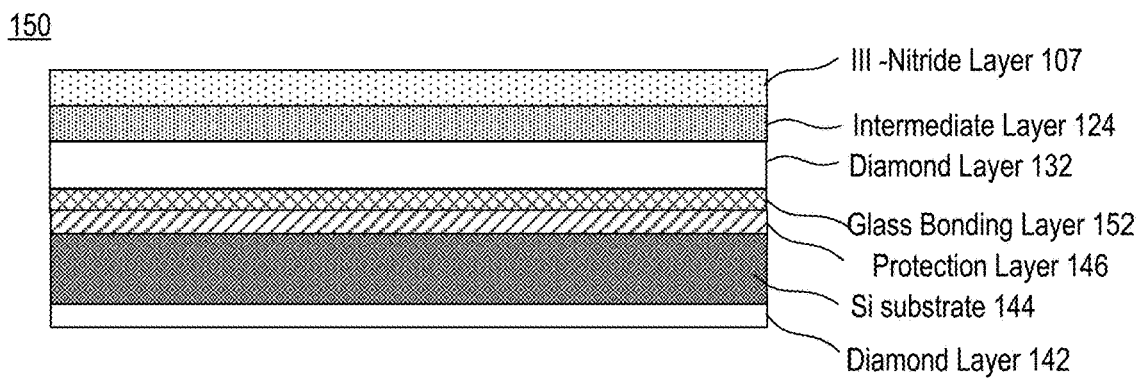

In embodiments, the wafer 136 is mounted on the support wafer 140 and heated at the temperature of 900-1000° C. to melt the glass coatings 138 and 148 and to form a glass bonding layer 152. FIG. 11 shows a wafer 150 that includes the support wafer 140 bonded to the wafer 136 by the glass bonding process.

As discussed above in conjunction with FIGS. 2B and 5, the III-Nitride layer may have a GaN buffer layer only i.e., the III-Nitride layer 107 may include only GaN layer. In such a case, another III-Nitride layer 162, such as AlGaN/InAlN layer, may be formed (regrown) on the GaN buffer layer, resulting in the III-Nitride layer stack 164. In the following sections, the III-Nitride layer stack 164 is referred to as a III-Nitride layer, even though more than one III-Nitride layer may be included in the III-Nitride layer 164.

In embodiments, an edge trimming process may be optionally performed on the wafer 160 to make primary/flat zone in the wafer 160 before shipping to a foundry for further processing of the wafer 160.

Figure 12:
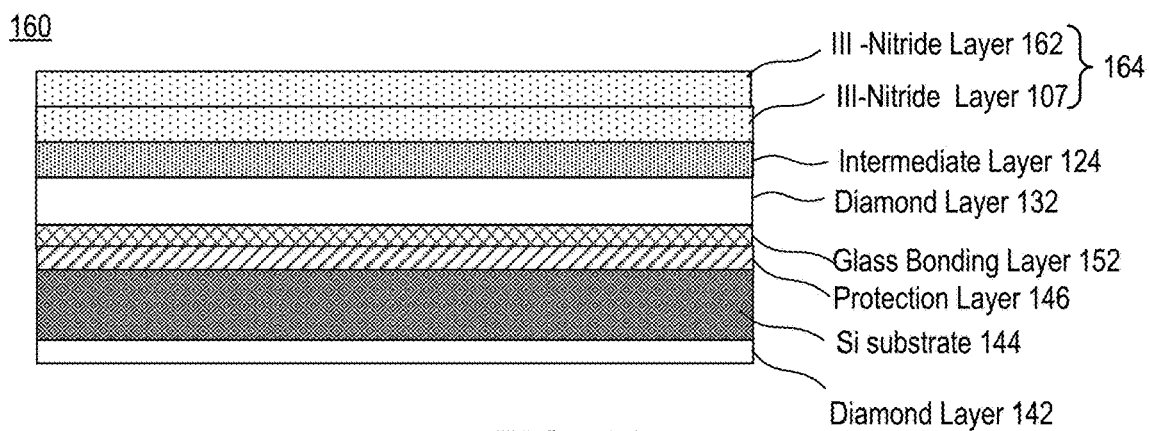
Figure 13:
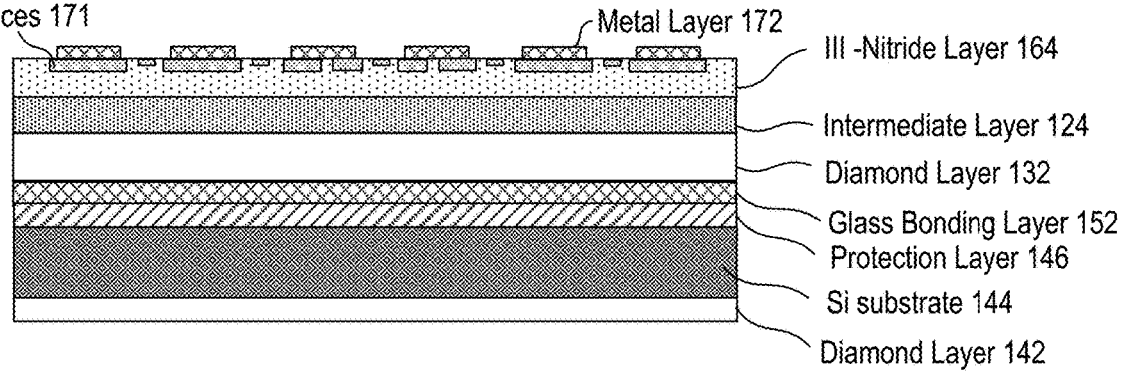
FIGS. 13-17 show an exemplary process for device processing the wafer in FIG. 12 to fabricate HEMTs according to embodiments of the present disclosure.

FIGS. 13-17 show an exemplary process for device processing the wafer 160 in FIG. 12 to fabricate HEMTs according to embodiments of the present disclosure. In embodiments, as shown in FIG. 13, the wafer 170 may include various semiconductor devices 171, such as semiconductor transistors, formed in the III-Nitride layer 164. In embodiments, the semiconductor devices 171 may be formed by suitable semiconductor processes.

In embodiments, upon forming the semiconductor devices 171, a patterned metal layer 172 may be formed on the III-Nitride layer 164. In embodiments, the metal layer 172 may be formed of an ohmic alloy (preferably, but not limited to, Au, Ag, Ni, Ti, Al or any combination thereof) that alloys at 850° C. It is noted that various fabrication methods may be used to form the metal layer 172. In embodiments, the metal layer 172 may be annealed to reduce the contact resistance between the metal layer 172 and the III-Nitride layer 164. In embodiments, the metal layer 172 may be patterned by a suitable process, such as photolithography.

Figure 14:
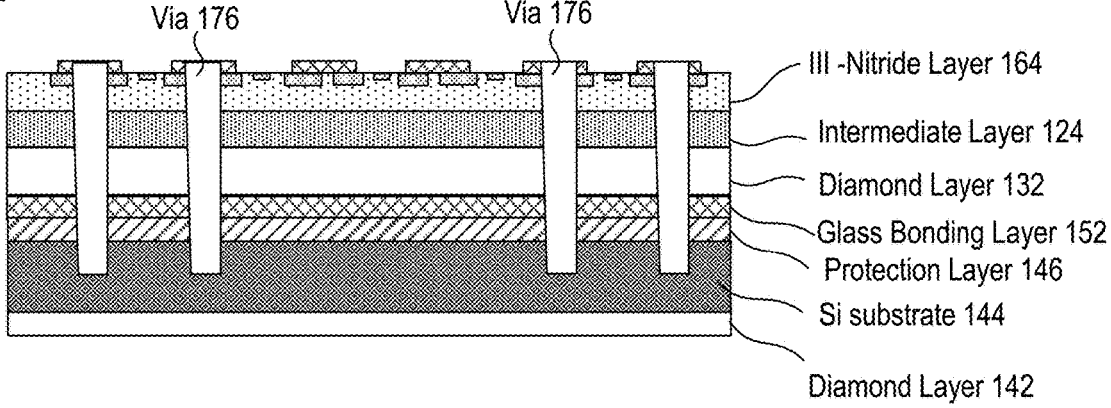

In embodiments, as shown in FIG. 14, the wafer 174 may include one or more vias 176 formed by a laser drilling technique or any other suitable technique. In the conventional techniques, vias are drilled from a substrate side toward a III-Nitride side of the wafer. If the conventional techniques using laser beams are performed to drill vias from the diamond layer 142 toward the III-Nitride layer 164, the diamond layer 132, which may be formed of poly crystalline diamond, may scatter the laser beam, causing unintended subsidiary drilled spots or damages to the area of metal-semiconductor interface, especially gate contact area.

In contrast, in embodiments, the one or more vias 176 may be drilled from the metal layer 172 toward the protection layer 144. This drilling technique of the present disclosure may reduce the scattering of the laser beam by the diamond layer 132. Also, the heat energy, which may be accumulated in the gate contact area during the drilling process of the metal layer 172 and the III-Nitride layer 164, may be discharged to the diamond layer 132 by heat transfer, which further reduces the thermal damages to the III-Nitride layer 164. In embodiments, the one or more vias 176 may extend from the metal layer 172 into the protection layer 146 of the support wafer 140.

Figure 15:
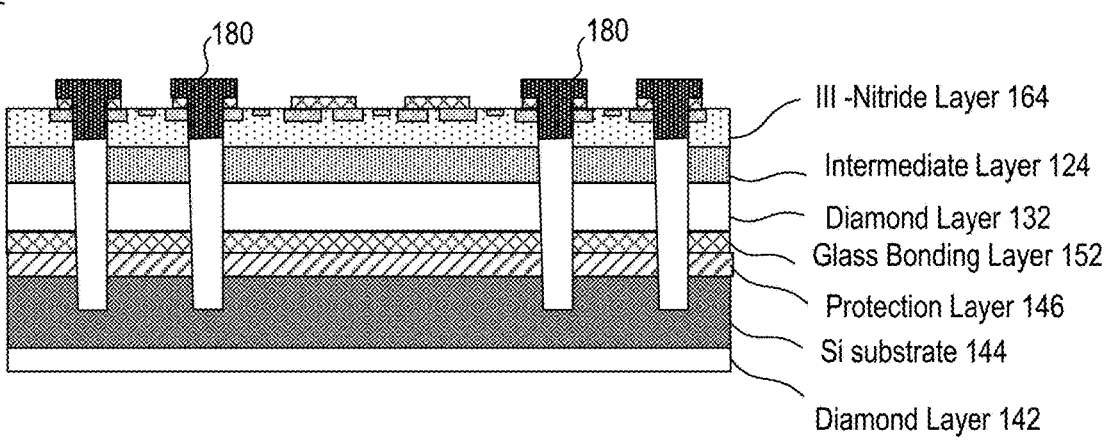
Figure 16:
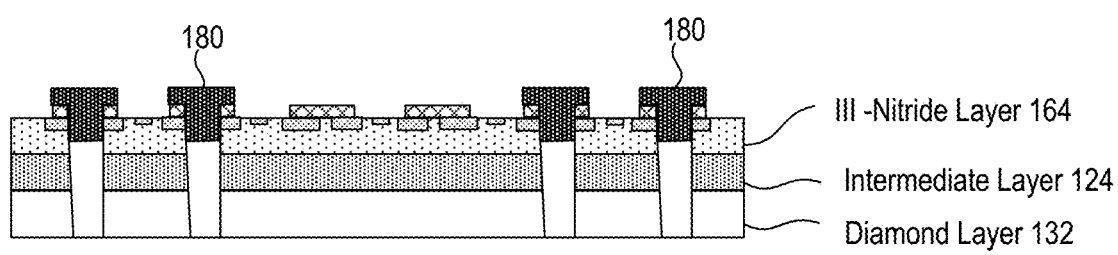

In embodiments, as shown in FIG. 15, a chemical or electrochemical gold plating technique may be used to deposit a thin layer of gold 180 on the metal layer 172 and in a top portion of the one or more vias 176. It is noted that other suitable metal may be used in place of the gold to form the metal layer 180 and other suitable techniques may be used to form the metal layer 180.

It is noted that the processes in FIGS. 14 and 15 are exemplary processes performed on the wafer 160. As such, it should be apparent to those of ordinary skill in the art that other suitable processes may be performed on the wafer 160 to form various semiconductor devices in the wafer 160.

As discussed above, in embodiments, the support wafer 140 is bonded to the wafer 134 so as to bolster the mechanical strength of the wafer 134. As such, upon completion of the final passivation process (or any other process that may cause unintended mechanical deformation (such as bending and warping) of the wafer 178, the support wafer 140 may be removed from the wafer 178. In embodiments, the diamond layer 142, silicon substrate 144, protection layer 146 and glass bonding layer 152 may be removed from the wafer 178 by a lapping process and/or any other suitable processes, as shown FIG. 16. In embodiments, the bottom surface of the diamond layer 132 may be further cleaned by a dry etching technique so as to remove remaining glass material on the bottom surface of the diamond layer 132.

Figure 17:
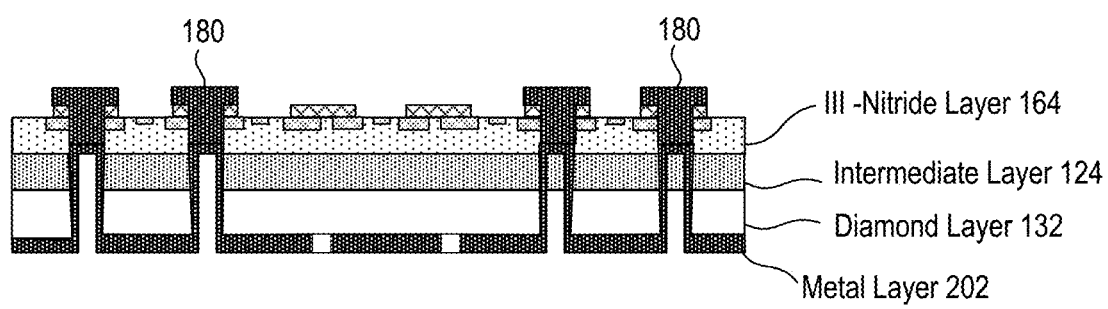

In FIG. 17, the wafer 200 may include a metal layer 202 that is deposited on the bottom surface of the diamond layer 132 and the side surfaces of the one or more vias 176 by the Au plating technique. It is noted that other suitable metal may be used in place of the gold for the metal layer 202, and other suitable techniques may be used to form the metal layer 202 on the diamond surface 132. In embodiments, the metal layer 202 may be in electrical contact with the metal layers 172 and 180 through the vias 176.

In embodiments, other processes, such as street etching, may be performed on the metal layer 202. Upon completion of the processes to form semiconductor devices in the wafer 200, the wafer 200 may be diced for singulation.

Figure 18:
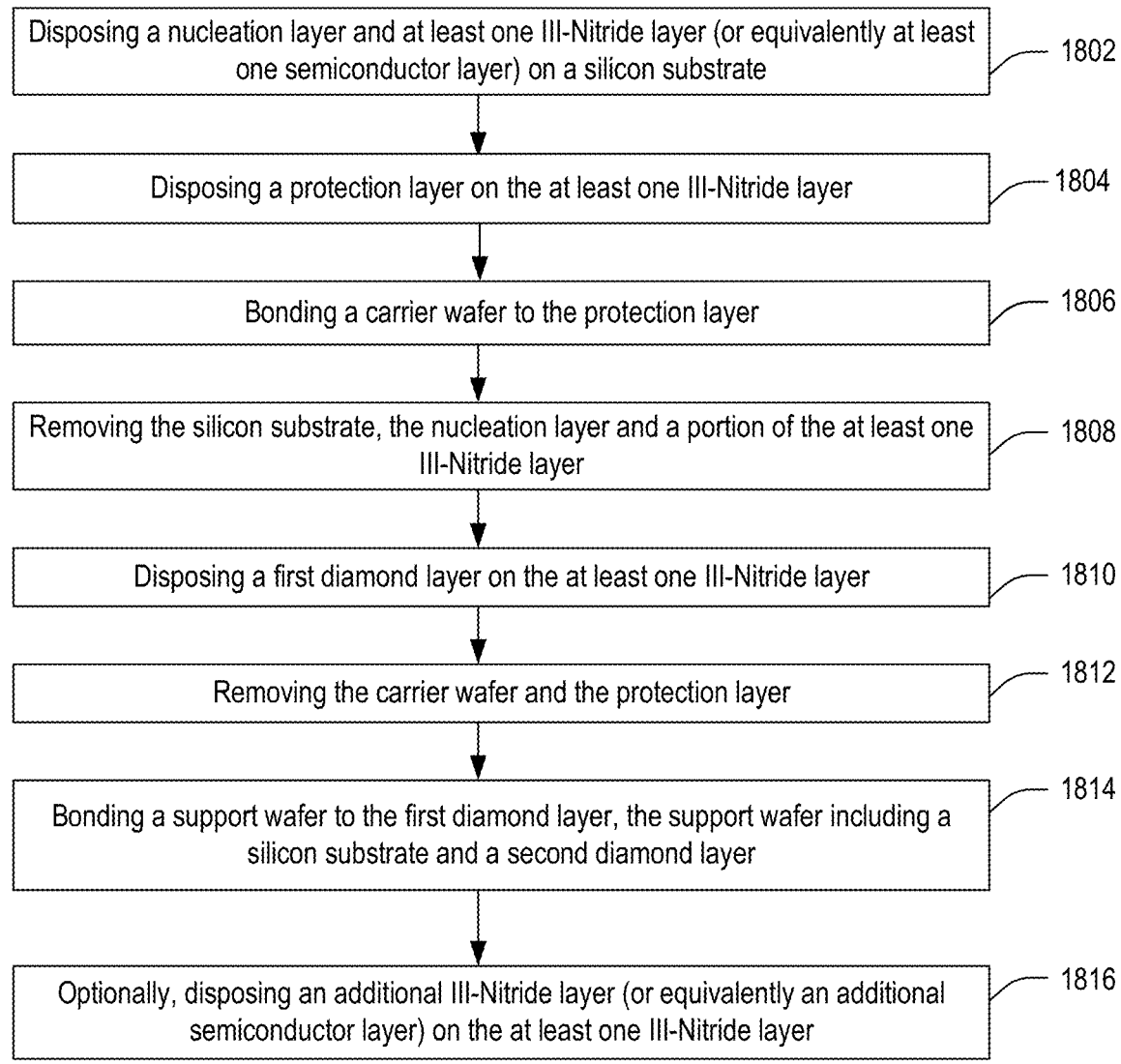
FIG. 18 shows a flowchart of an exemplary process for fabricating a semiconductor wafer according to embodiments of the present disclosure.

FIG. 18 shows a flowchart 1800 of an exemplary process for fabricating a semiconductor wafer according to embodiments of the present disclosure. At step 1802, the nucleation layer 104 and the III-Nitride layer (or equivalently, a semiconductor layer that includes a III-Nitride compound) 106 may be disposed on the silicon substrate 102. In embodiments, the nucleation layer 104 may be formed between the silicon substrate 102 and the III-Nitride layer to prevent cracks in the III-Nitride layer 106. In embodiments, the III-Nitride layer 106 may include only GaN layer 106-22. In alternative embodiments, the III-Nitride 106 layer may include the GaN layer 106-14 and the AlGaN/InAlN layer 106-12.

At step 1804, the protection layer 108 may be disposed on the III-Nitride layer 106, where the protection layer may be formed of a material that includes one or more of SiN, poly silicon, $Al_2O_3$, AlN and GaN.

At step 1806, the carrier wafer 110 having the silicon carrier wafer 116 may be bonded to the protection layer 108. In embodiments, the glass coating layers 112 and 114 may be formed on the protection layer 108 and silicon carrier wafer 116, respectively, and heated at the temperature of 900-1000° C. Then, at step 1808, the silicon substrate 102 and nucleation layer 104 may be removed.

It is noted that a portion of the III-Nitride layer 106 is also removed at step 1808. In embodiments, when the III-Nitride layer 106 is formed of a GaN only, a portion of the GaN near the interface between the GaN layer 106-22 and nucleation layer 104 may include cracks developed during deposition of the GaN layer 106-22. Similarly, in alternative embodiments, when the III-Nitride layer 107 includes the GaN buffer layer 106-14 and the AlGaN/InAlN layer 106-12, a portion of the GaN layer near the interface between the GaN layer 106-14 and nucleation layer 104 may include cracks developed during deposition of the GaN layer 106-14 and the AlGaN/InAlN layer 106-12. In both cases, a portion of the GaN layer having the cracks may be removed so that the remaining III-Nitride layer 107 may not include any crack, at step 1808.

At step 1810, the diamond layer 128 may be disposed on the III-Nitride layer 107. In embodiments, the intermediate layer 124 may include first and second layers, where the first layer may be disposed between the III-Nitride layer 107 and the diamond layer 128 and may mitigate the stress due to the mismatch of CTEs of the diamond layer 128 and the III-Nitride layer 107. In embodiments, the first layer may be formed of a dielectric material, such as poly-Si, $SiO_2$, $Al_2O_3$ or SiN. In embodiments, the second layer (which is a seed layer) may be disposed between the first layer and the diamond layer 128, where the seed layer may include diamond nano particle (diamond seed particles). In embodiments, after the step 1810 is completed, a lapping process may be carried out to enhance the surface flatness of the diamond layer 128.

At step 1812, the carrier wafer 110 and the protection layer 108 may be removed. At step 1814, the support wafer 140 may be bonded to the diamond layer 132, where the support wafer 140 may include the diamond layer 142, silicon substrate 144, and protection layer 146. In embodiments, the glass coatings 148 and 138 may be formed on the diamond layer 132 and the protection layer 146, respectively, and heated at the temperature of 900-1000° C. for glass bonding.

At step 1816, another III-Nitride layer (or equivalently, another semiconductor layer having a III-Nitride compound) 162 may be optionally disposed on the III-Nitride layer 107. In embodiments, when the III-Nitride layer 107 includes only the GaN buffer layer 106-22, an additional AlGaN/InAlN layer 162 may be formed on the GaN buffer layer.

Figure 19:
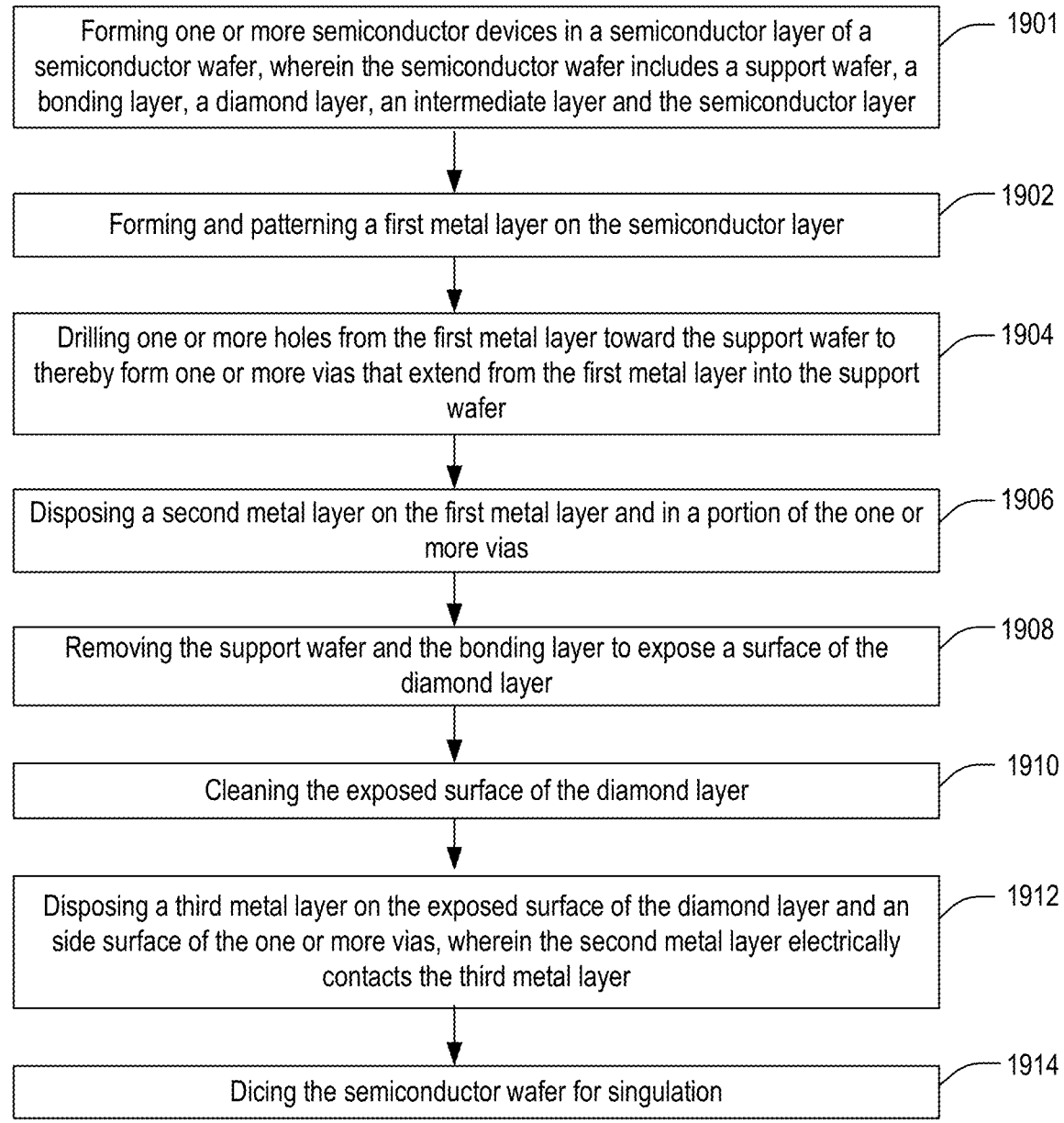
FIG. 19 shows a flowchart of an exemplary process for processing a semiconductor wafer according to embodiments of the present disclosure.

FIG. 19 shows a flowchart of an exemplary process for processing a semiconductor wafer according to embodiments of the present disclosure. At step 1901, semiconductor devices 171, such as semiconductor transistors, may be formed in the III-Nitride layer (or a semiconductor layer) 164 of the semiconductor wafer 160. As discussed above, the semiconductor wafer 160 may include the support wafer 140, glass bonding layer 152, diamond layer 132, intermediate layer 124 and the III-Nitride layer 164. In embodiments, the support wafer 140 may include the protection layer 146, silicon substrate 144 and diamond layer 142. At step 1902, the metal layer 172 may be formed and patterned on the III-Nitride layer 164.

At step 1904, a laser drilling technique or any other suitable technique may be performed to drill one or more holes from the metal layer 172 toward the silicon substrate 144 to thereby form the one or more vias 176, where the one or more vias 176 may extend from the metal layer 172 into the protection layer 146 of the support wafer 140. Then, at step 1906, the metal layer 180 may be formed on the metal layer 172 and in a top portion of the one or more vias 176. Next, at step 1908, the support wafer 140 and the glass bonding layer 152 may be removed to expose the bottom surface of the diamond layer 132. Optionally, in embodiments, the bottom surface of the diamond layer 132 may be further cleaned by a dry etching technique so as to remove the remaining glass material on the bottom surface of the diamond layer 132, at step 1910.

At step 1912, the metal layer 202 may be disposed on the exposed surface of the diamond layer 132 and the side surfaces of the one or more vias 176 by the Au plating technique. It is noted that other suitable metal may be used in place of the gold for the metal layer 202, and other suitable techniques may be used to form the metal layer 202 on the diamond surface 132. In embodiments, the metal layer 202 may be in electrical contact with the metal layers 172 and 180 through the vias 176. Then, at step 1914, the wafer 200 may be diced for singulation.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the appended claims.

What is claimed is:

1. A method for processing a semiconductor wafer, comprising:
   disposing and patterning a first metal layer on a semiconductor layer of a semiconductor wafer, wherein the semiconductor wafer includes a support layer, a bonding layer, a first diamond layer, an intermediate layer and the semiconductor layer;

drilling one or more holes from the first metal layer toward the support layer to thereby form one or more vias that extend from the first metal layer into the support layer;

disposing a second metal layer on the first metal layer and in a portion of the one or more vias; and removing the support layer and the bonding layer to expose a surface of the first diamond layer, wherein the support layer includes a second diamond layer, a silicon substrate, and a protection layer.

2. The method of claim 1, further comprising:
cleaning the exposed surface of the first diamond layer.

3. The method of claim 1, further comprising:
disposing a third metal layer on the exposed surface of the first diamond layer and a side surface of the one or more vias, wherein the third metal layer electrically contacts the second metal layer.

4. The method of claim 1, wherein the protection layer is formed of a material that includes one or more of SiN, poly-Si, Al2O3, AlN and GaN.

5. The method of claim 1, wherein the bonding layer is formed of glass.

6. The method of claim 1, further comprising:
prior to the step of disposing and patterning the first metal layer, forming one or more semiconductor devices in the semiconductor layer.

7. The method of claim 6, wherein the one or more semiconductor devices includes one or more high electron mobile transistors (HEMTs).

8. The method of claim 6, further comprising:
prior to the step of forming the one or more semiconductor devices in the semiconductor layer, forming the intermediate layer on the semiconductor layer, forming the first diamond layer on the intermediate layer, forming the bonding layer on the first diamond layer, and attaching the support layer to the bonding layer.

9. The method of claim 8, wherein the semiconductor layer includes a III-Nitride compound.

10. The method of claim 8, wherein the semiconductor layer includes a GaN layer.

11. The method of claim 10, further comprising:
forming an additional semiconductor layer on the semiconductor layer on a first side of the semiconductor layer opposite to a second side of the semiconductor layer where the intermediate layer is formed.

12. The method of claim 11, wherein the additional semiconductor layer includes a III-Nitride compound.

13. The method of claim 12, wherein the additional semiconductor layer is an AlGaN layer.

14. The method of claim 12, wherein the additional semiconductor layer is an InAlN layer.

* * * * *